(12) United States Patent
Matsudate et al.

(10) Patent No.: US 7,915,814 B2
(45) Date of Patent: Mar. 29, 2011

(54) ORGANIC ELECTRO-LUMINESCENT DISPLAY DEVICE

(75) Inventors: Noriharu Matsudate, Kujukuri (JP); Takeshi Ookawara, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 119 days.

(21) Appl. No.: 12/285,688

(22) Filed: Oct. 10, 2008

(65) Prior Publication Data
US 2009/0096371 A1 Apr. 16, 2009

(30) Foreign Application Priority Data

Oct. 10, 2007 (JP) .................................. 2007-264503

(51) Int. Cl.
*H01L 51/50* (2006.01)
(52) U.S. Cl. ....................................... 313/505
(58) Field of Classification Search .......... 313/505–506, 313/504
See application file for complete search history.

(56) References Cited

U.S. PATENT DOCUMENTS
| | | | |
|---|---|---|---|
| 6,538,374 B2 | 3/2003 | Hosokawa | |
| 6,900,470 B2 | 5/2005 | Kobayashi et al. | |
| 2002/0158835 A1* | 10/2002 | Kobayashi et al. | 345/100 |

FOREIGN PATENT DOCUMENTS
| | | |
|---|---|---|
| JP | 2001-230086 | 2/2000 |
| JP | 2002-318556 | 4/2001 |

* cited by examiner

*Primary Examiner* — Toan Ton
*Assistant Examiner* — Hana S Featherly
(74) *Attorney, Agent, or Firm* — Stites & Harbison PLLC; Juan Carlos A. Marquez, Esq.

(57) ABSTRACT

A top-emission-type organic EL display device which exhibits uniform screen brightness is realized by preventing a voltage drop of an upper electrode formed of a transparent conductive film. Pixels each of which is sandwiched between an upper electrode and a lower electrode are arranged in a matrix array to form a display region. An auxiliary electrode extends in the lateral direction between the pixels and the pixels for preventing a voltage drop of the upper electrode. A current supply line which supplies an electric current to the upper electrode and the auxiliary electrodes are made conductive with each other by forming a through hole in an insulation layer. To ensure reliability of connection at the through hole, a contact electrode made of metal which overlaps with the auxiliary electrode is formed on the through hole by vapor deposition.

5 Claims, 6 Drawing Sheets

ORGANIC ELECTRO-LUMINESCENT DISPLAY DEVICE

CLAIM OF PRIORITY

The present application claims priority from Japanese Application JP 2007-264503 filed on Oct. 10, 2007, the content of which is hereby incorporated by reference into this application.

BACKGROUND OF THE INVENTION

1. Field of the Invention

The present invention relates to an organic electro-luminescent (EL) display device, and more particularly to a top-emission-type organic EL display device which can enhance the uniformity of brightness and can enhance the reliability of the organic EL display device.

2. Description of the Related Art

An organic EL display device is classified into a bottom-emission-type organic EL display device in which light emitted from organic EL layers is taken out in the direction of a glass substrate on which the organic EL layers and the like are formed and a top-emission-type organic EL display device in which light emitted from organic EL layers is taken out in the direction opposite to a glass substrate on which the organic EL layers and the like are formed. The top-emission-type organic EL display device has an advantage that the respective organic EL layers can ensure a large area thus increasing the brightness of a display.

In the organic EL display device, the organic EL layer is sandwiched between a lower electrode and an upper electrode, and emission of light from the organic EL layer is controlled by applying a fixed voltage to the upper electrode and by applying a data signal voltage to the lower electrode thus forming an image. The supply of the data signal voltage to the lower electrode is performed via a thin film transistor (TFT). In the top-emission-type organic EL display device, it is also possible to form the organic EL layer on the TFT and the like and hence, a light emission area of the display can be increased.

The top-emission-type organic EL display device radiates light toward the upper electrode side and hence, it is necessary to make the upper electrode transparent. As a transparent electrode, an ITO (Indium Tin Oxide) film, an IZO (Indium Zinc Oxide) film or the like which is a metallic oxide conductive film is used in general. However, ITO, IZO or the like exhibits high resistance compared to metal. Accordingly, when a distance between the upper electrode and a terminal portion which supplies an electric current to the upper electrode is increased, a potential of the upper electrode arranged in the vicinity of the terminal portion and a potential of the upper electrode remote from the terminal portion differ from each other. This difference appears as the non-uniformity of brightness thus deteriorating an image quality.

JP-A-2002-318556 (patent document 1) and JP-A-2001-230086 (patent document 2) disclose a top-emission-type organic EL display device in which an auxiliary electrode is provided for suppressing a phenomenon that a potential of an upper electrode differs depending on a position of the upper electrode due to resistance of the upper electrode.

SUMMARY OF THE INVENTION

In the technique disclosed in patent document 1, the auxiliary line is formed using low-resistance metal below a bank formed between pixels and pixels. Then, a through hole is formed in the bank so as to electrically connect an upper electrode and the auxiliary line with each other via the through hole. The auxiliary line exhibits low resistance and hence, even in a pixel which is remote from a terminal portion, it is possible to suppress the lowering of a potential of the upper electrode. However, in the above-mentioned technique, patterning of the auxiliary line becomes necessary in forming the auxiliary line below the bank. Patterning of the auxiliary lines is performed by photolithography and hence, a manufacturing cost is pushed up. Further, the connection at a through hole portion formed in the bank is performed only by the upper electrode. The through hole formed in the bank is deep and hence, it is difficult to acquire the reliable conduction at the through hole portion.

In the technique disclosed in patent document 2, the upper electrodes are divided into literal upper electrodes which are formed on the organic EL layer and wiring portions (auxiliary electrodes) which supply an electric current to the upper electrodes from terminal portions, and the wiring portions are formed using metal which exhibits low resistance. This technique also requires patterning of the auxiliary electrodes. Patterning of the auxiliary electrodes is performed by photolithography and hence, a manufacturing cost is pushed up. Further, in the above-mentioned technique disclosed in patent document 2, although the bank is not formed between the pixels and the pixels, when the bank is formed, in the same manner as patent document 1, a drawback on the conduction at the through hole arises.

The present invention has been made to realize a top-emission-type organic EL display device which, in using an auxiliary electrode for preventing a voltage drop of an upper electrode due to large resistance of the upper electrode, can suppress the rise of a manufacturing cost and, at the same time, can ensure the reliable conduction at a through hole portion.

The present invention has been made to overcome the above-mentioned drawbacks. According to the present invention, an auxiliary electrode is formed above or below an upper electrode by vapor deposition or sputtering for suppressing a voltage drop of the upper electrode. The connection between a current supply line which supplies an electric current to the upper electrode and is formed in the same layer as a drain line and the auxiliary electrode is performed via a through hole formed in an insulation film. For suppressing a connection failure at the through hole or a phenomenon that the resistance is increased at the through hole, a contact electrode made of metal is formed on the through hole portion by mask vapor deposition or sputtering in an overlapping manner with the auxiliary electrode. Following are specific means for overcoming the above-mentioned drawbacks.

(1) The present invention provides an organic EL display device having a display region on which pixels each having an organic EL layer sandwiched by an upper electrode and a lower electrode are arranged in a matrix array, wherein the upper electrode is formed of a transparent electrode, an auxiliary electrode which is conductive with the upper electrode extends between the pixels and the pixels, the auxiliary electrode is connected with a current supply line which supplies an electric current to the upper electrode via a through hole formed in an insulation layer, and a contact electrode is formed on the through hole in an overlapping manner with the auxiliary electrode.

(2) In the organic EL display device having the above-mentioned constitution (1), the contact electrode is made of metal, and has a film thickness larger than a film thickness of the auxiliary electrode.

(3) In the organic EL display device having the above-mentioned constitution (1), the auxiliary electrode is formed by mask vapor deposition or mask sputtering, and the contact electrode is formed by mask vapor deposition or mask sputtering.

(4) In the organic EL display device having the above-mentioned constitution (1), the contact electrode is formed above the auxiliary electrode.

(5) In the organic EL display device having the above-mentioned constitution (1), the contact electrode and the auxiliary electrode are made of the same material.

(6) In the organic EL display device having the above-mentioned constitution (1), the auxiliary electrode is formed over the upper electrode.

(7) In the organic EL display device having the above-mentioned constitution (1), the auxiliary electrode is formed below the upper electrode.

(8) The present invention also provides an organic EL display device having a display region on which pixels each having an organic EL layer sandwiched by an upper electrode and a lower electrode are arranged in a matrix array, wherein the upper electrode is formed of a transparent electrode, an auxiliary electrode which is conductive with the upper electrode extends between the pixels and the pixels, the auxiliary electrode is connected with a current supply line which supplies an electric current to the upper electrode via a through hole formed in an insulation layer outside the display region, and a contact electrode is formed on the through hole in an overlapping manner with the auxiliary electrode, and the contact electrode is configured to cover the plurality of through holes in common.

(9) In the organic EL display device having the above-mentioned constitution (8), the auxiliary electrode is formed by mask vapor deposition or mask sputtering, and the contact electrode is formed by mask vapor deposition or mask sputtering.

(10) The present invention also provides an organic EL display device having a display region on which pixels each having an organic EL layer sandwiched by an upper electrode and a lower electrode are arranged in a matrix array, wherein the upper electrode is formed of a transparent electrode, an auxiliary electrode which is conductive with the upper electrode extends between the pixels and the pixels, the auxiliary electrode is connected with a current supply line which supplies an electric current to the upper electrode via a through hole formed in an insulation layer within the display region and between the pixels and the pixels, and a contact electrode is formed on the through hole in an overlapping manner with the auxiliary electrode.

(11) In the organic EL display device having the above-mentioned constitution (10), a width of the contact electrode is set larger than a width of the auxiliary electrode.

(12) In the organic EL display device having the above-mentioned constitution (10), a bank is formed between the pixels and the pixels, the auxiliary electrode is formed on the bank, and the through hole is formed in the bank and other insulation layer in a penetrating manner.

(13) In the organic EL display device having the above-mentioned constitution (10), the auxiliary electrode is formed by mask vapor deposition or mask sputtering, and the contact electrode is formed by mask vapor deposition or mask sputtering.

According to the present invention, the auxiliary electrodes are formed by mask vapor deposition or mask sputtering and hence, the formation of the auxiliary electrodes requires no photolithography step thus realizing the formation of the auxiliary electrodes without largely pushing up a manufacturing cost.

Further, although the connection between a current supply line which supplies an electric current to the upper electrode and the auxiliary electrode is established via the through hole formed in the insulation film, the through hole is extremely deep in general and hence, the conduction failure is liable to occur. According to the present invention, in place of establishing the connection with the current supply line using only the auxiliary electrode formed on the through hole, the contact electrode is formed in an overlapping manner with the auxiliary electrode at the through hole and hence, it is possible to prevent the occurrence of conduction failure at the contact portion.

In this manner, according to the present invention, it is possible to suppress a phenomenon that a potential of the upper electrode differs depending on a place and, at the same time, it is possible to enhance reliability of conduction between the current supply line and the upper electrode. Accordingly, it is possible to provide a top-emission-type organic EL display device which exhibits excellent uniformity of brightness and high reliability.

DESCRIPTION OF THE PREFERRED EMBODIMENTS

Hereinafter, the present invention is explained in detail in conjunction with embodiments.

Embodiment 1

Figure 1:
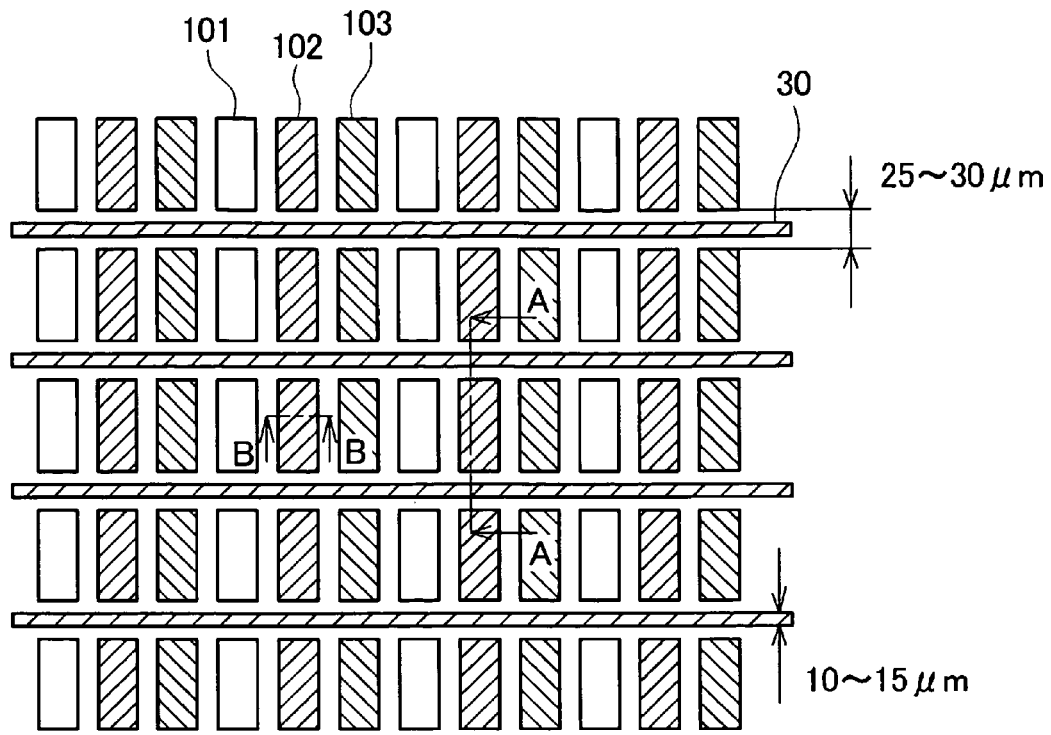
FIG. 1 is a plan view of a display region of an organic EL display device according to an embodiment 1.
Figure 2:
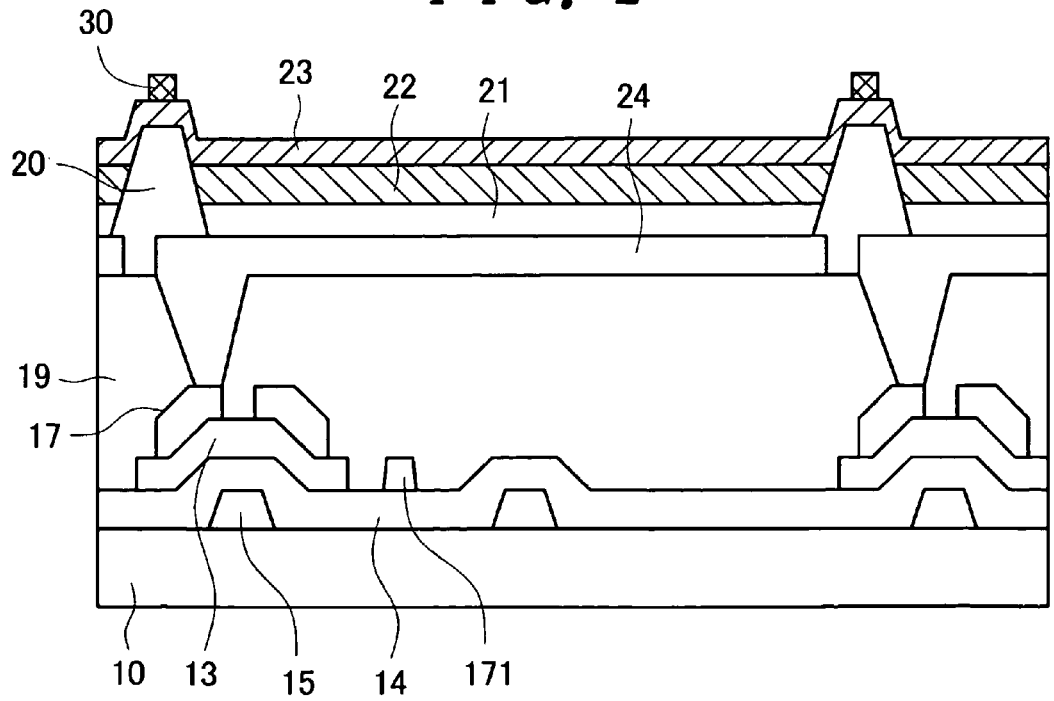
FIG. 2 is a cross-sectional view taken along a line A-A in FIG. 1.

FIG. 1 is a plan view of a display region of a top-emission-type organic EL display device according to the present invention. FIG. 2 is a cross-sectional view taken along a line A-A in FIG. 1. In FIG. 1, a red pixel 101, a green pixel 102 and a blue pixel 103 are arranged sequentially in the lateral direction. The pixels having the same color are arranged in the longitudinal direction. Each pixel includes an organic EL layer 22 which emits color of red, green or blue. Each organic EL layer 22 is covered with an IZO film which constitutes a transparent electrode forming an upper electrode 23. The transparent electrode may be also formed of an ITO film or the like besides the IZO film.

An auxiliary electrode 30 extends in the lateral direction between the pixels and the pixels arranged in the longitudinal direction. The auxiliary electrode 30 is formed on the upper electrode 23 formed in a matted manner by mask vapor deposition. In the present invention, the auxiliary electrode 30 is formed by vapor deposition using a mask or sputtering and hence, a photolithography step is unnecessary for forming the auxiliary electrode 30 whereby the present invention is advantageous in cost. A distance between the pixels and the pixels in the longitudinal direction is approximately 25 μm to 30 μm. Accordingly, a width of the auxiliary electrode 30 is smaller than the distance between the pixels and the pixels. That is, the width of the auxiliary electrode 30 is set to 10 μm to 15 μm. Vapor deposition of the auxiliary electrode 30 having such an extent of width becomes possible by mask vapor deposition or sputtering.

Since it is necessary to set the resistance of the auxiliary electrode 30 to a small value, the auxiliary electrode 30 is formed using metal. As a material of the auxiliary electrode 30, Al, Al alloy, Zn, Mg or the like can be named. Since Al or Al alloy exhibits low resistance, these materials can be preferably used for forming the auxiliary electrode 30. Further, these materials can be easily applied to the upper electrode 23 by vapor deposition, sputtering or the like. Zn can be applied to the upper electrode 23 by resistance heating, induction heating, EB vapor deposition or sputtering. Further, when Zn is used as a material of the auxiliary line, the auxiliary line exhibits black color and hence, the auxiliary line plays a role of a black matrix thus contributing to the enhancement of contrast of an image quality. Mg can be applied to the upper electrode 23 by resistance heating, induction heating, EB vapor deposition or sputtering.

By setting the sheet resistance on a display region after the auxiliary lines are formed to 10 Ω/□ or less, it is possible to suppress a phenomenon that a potential of the upper electrode 23 differs depending on a place. In this case, the sheet resistance is the sheet resistance of the combination of the auxiliary electrodes 30 and the upper electrodes 23. That is, the sheet resistance is largely decreased compared to the sheet resistance of a case in which only the upper electrodes 23 are provided.

FIG. 2 is a cross-sectional view taken along a line A-A in FIG. 1. In FIG. 2, a bottom-gate-type thin film transistor (TFT) is formed on an element substrate 10 made of glass. Although the bottom-gate-type TFT is used in the constitution shown in FIG. 2, as explained later, a top-gate-type TFT may also be used.

In FIG. 2, a gate electrode 15 is formed on the element substrate 10. A gate insulation film 14 made of SiN is formed on the element substrate 10 so as to cover the gate electrode 15. A semiconductor layer 13 is formed over the gate electrode 15. The semiconductor layer 13 forms a channel portion of the TFT. Although a source electrode or a drain electrode (SD electrode 17) is arranged on the semiconductor layer 13, an n+Si layer not shown in the drawing is formed between the semiconductor layer 13 and the SD electrode 17 for ensuring an ohmic contact.

After etching a portion of the n+Si layer and a portion of the semiconductor layer 13 of the channel portion by channel etching, an organic passivation film 19 is formed. In FIG. 2, the passivation film is constituted of only the organic passivation film 19. However, there may be a case that an inorganic passivation film 18 made of SiN or the like may be formed below the organic passivation film 19. Since the organic passivation film 19 also plays a role of a leveling film, the organic passivation film 19 has a large thickness of approximately 1 to 4 μm.

A reflection electrode 24 made of Al or Al alloy is formed on the organic passivation film 19. Since the present invention relates to the top-emission-type organic EL display device, it is necessary to radiate light from the organic EL layer 22 in the direction opposite to the element substrate 10 and hence, it is necessary to form the reflection electrode 24 on the organic passivation film 19. A through hole is formed in the organic passivation film 19 so as to make the reflection electrode 24 and the SD electrode 17 of the TFT conductive with each other.

The organic EL layer 22 of this embodiment corresponds to a top-cathode-type display device. In this case, it is necessary to use a lower electrode 21 having a large work function. Al or Al alloy used as a material for forming the reflection electrode 24 has a relatively small work function and hence, Al or Al alloy is not suitable as a material of an anode. Accordingly, the lower electrode 21 made of IZO is formed on the reflection electrode 24.

The organic EL layer 22 which emits light is formed on the lower electrode 21. The organic EL layer 22 is, in general, constituted of five layers consisting of a hole injection layer, a hole transport layer, a light emission layer, an electron transport layer, and an electron injection layer. The respective layers of the organic EL layer 22 are extremely thin. Although thicknesses of the respective layers differ depending on color of emitted light, the thickness of the hole transport layer is 120 nm to 250 nm, the thickness of the light emission layer is 30 nm to 40 nm, the thickness of the electron transport layer is 10 nm, and the thickness of the electron injection layer is approximately 60 nm. In this manner, even when the organic EL layer is formed by staking these five layers, the organic EL layer is extremely thin. Accordingly, when a step portion exists on a back ground, a broken step of the film easily occurs.

To prevent such a broken step of the organic EL layer 22, a bank 20 is formed between the respective pixels. The bank 20 is, in general, formed of an acrylic film, a polyimide film or the like which constitutes an organic film. The bank 20 prevents the organic EL layer 22 from being broken at an end portion thereof due to a stepped portion.

A transparent conductive film made of IZO which constitutes the upper electrode 23 is formed on the organic EL layers 22. The IZO film is formed on the whole display part including portions above the banks 20 by vapor deposition. Light from the organic EL layer 22 is radiated to the outside through the IZO film which constitutes the upper electrode 23 and hence, it is necessary to increase optical transmissivity of the IZO film. Because of such a condition, the IZO film cannot have a large film thickness and hence, the film thickness of the IZO film is set to approximately 30 nm. Accordingly, the sheet resistance of the IZO is high and hence, a voltage drop of the upper electrode 23 is induced thus giving rise to a phenomenon that a potential of the upper electrode differs depending on a place.

To prevent such a voltage drop of the upper electrode 23, the auxiliary electrode 30 is formed on the bank 20. This is because so long as the auxiliary electrode 30 is formed on the bank 20, there is no possibility that the auxiliary electrode 30 interrupts outputting of light from the organic EL layer 22. As has been explained in conjunction with FIG. 1, the auxiliary electrode 30 is formed in a laterally strip shape using metal which exhibits low resistance. A film thickness of the auxiliary electrode 30 is approximately 150 nm and hence, the film thickness of the auxiliary electrode 30 is large compared to the film thickness of the upper electrode 23. Further, the auxiliary electrode 30 is made of metal and hence, the auxiliary electrode 30 exhibits extremely small resistivity compared to resistivity of the upper electrode 23 made of metal oxide. Accordingly, it is possible to prevent the voltage drop of the upper electrode 23 with the use of the auxiliary electrode 30.

Figure 3:
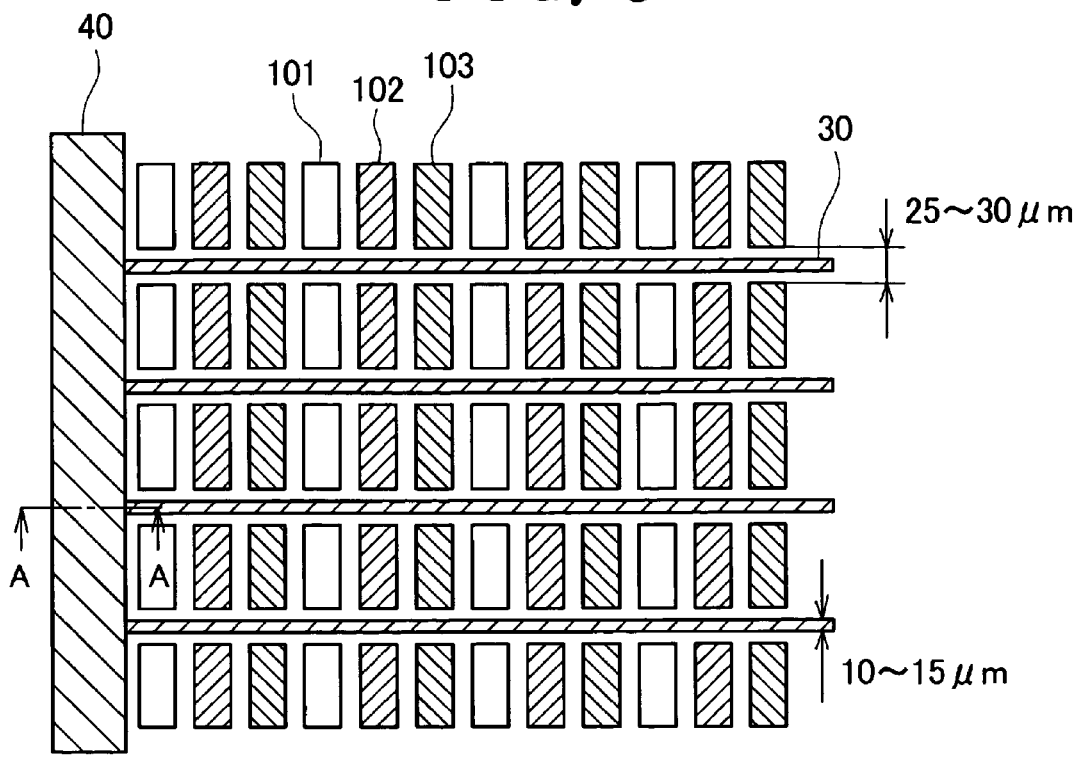
FIG. 3 is a plan view of a periphery of the display region of the organic EL display device according to the embodiment 1.

The auxiliary electrode 30 requires a contact portion for supplying an electric current to the upper electrode 23. In this embodiment, as shown in FIG. 3, the contact portion is arranged outside the display part in the lateral direction. In the contact portion, it is necessary to form a though hole in an insulation film and to connect the auxiliary electrode 30 and a current supply line 175 with each other via the through hole. Accordingly, the reliability of the through hole portion is important.

Figure 4:
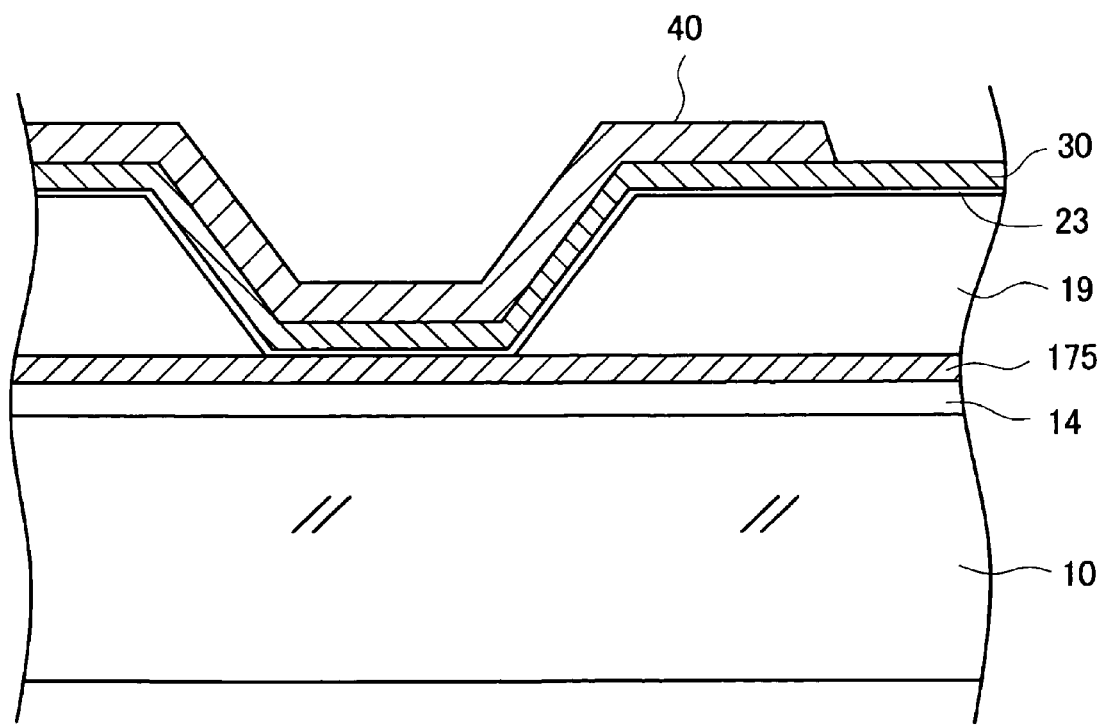
FIG. 4 is a cross-sectional view of a through hole portion of the embodiment 1.

In this embodiment, in the contact portion, in addition to the auxiliary electrode 30, a contact electrode 40 is separately formed by vapor deposition or sputtering thus enhancing the reliability of the through hole portion. FIG. 4 is a cross-sectional view taken along a line A-A in FIG. 3. In FIG. 4, the gate insulation film 14 is formed on the element substrate 10. The current supply line 175 is formed on the gate insulation film 14. The current supply line 175 is arranged on the same layer as the SD electrode 17 and is formed simultaneously formed with the SD electrode 17.

The organic passivation film 19 is formed on the current supply line 175, and the through hole is formed in the organic passivation film 19 so as to connect the auxiliary electrode 30 and the current supply line 175. Firstly, an IZO film which constitutes the upper electrode 23 is formed by vapor deposition so as to cover the through hole portion. Then, the auxiliary electrode 30 is formed on the upper electrode 23 by vapor deposition or sputtering.

However, a film thickness of the upper electrode 23 is approximately 30 nm, and a film thickness of the auxiliary electrode 30 is approximately 150 nm. On the other hand, a film thickness of the organic passivation film 19 is 1 μm to 4 μm, and is approximately 3 μm in many cases and hence, the film thickness of the organic passivation film 19 is extremely large.

Due to such constitution, the formed through hole is extremely deep and hence, when a broken step occurs on the upper electrode 23 or the auxiliary electrode 30, there may be a case that the sufficient conduction cannot be acquired. Particularly, an electric current is supplied to many pixels in the contact portion and hence, an amount of an electric current which flows in the contact portion is large thus easily giving rise to a drawback on reliability of the display device when the resistance at the through hole portion increased.

In the present invention, to overcome such a drawback, as shown in FIG. 4, in the contact portion, the contact electrode 40 made of metal is further formed on the auxiliary electrode 30. A film thickness of the contact electrode 40 is set larger than a film thickness of the auxiliary electrode 30. Further, in the vicinity of the through hole, the contact electrode 40 is also made larger than the auxiliary electrode 30 in a planar shape. By forming the contact electrode 40 using Al, Al alloy, Zn, Mg or the like which is equal to a material of the auxiliary electrode 30, a process for forming the contact electrode 40 can be simplified. However, the contact electrode 40 may be made of metal different from these metals.

By additionally forming the contact electrode 40 in the contact portion as in the case of this embodiment, the present invention can acquire an advantageous effect that a shape of the contact portion can be freely selected. For example, a width of the auxiliary line in the display region is restricted and hence, it is not possible to set the film thickness of the contact electrode 40 to an extremely large value. However, the film thickness of the contact electrode 40 in this embodiment can be changed depending on the degree of demand for reliability. Further, a pattern of the contact electrode 40 can be increased and hence, a planar shape of the contact electrode 40 can be also freely set depending on a demand with respect to the display device.

In FIG. 3 and FIG. 4, the contact electrode is formed above the auxiliary electrode in the contact portion. As an opposite case, the auxiliary electrode may be formed below the contact electrode. The same goes for an embodiment 2 and an embodiment 3 described layer.

Figure 5:
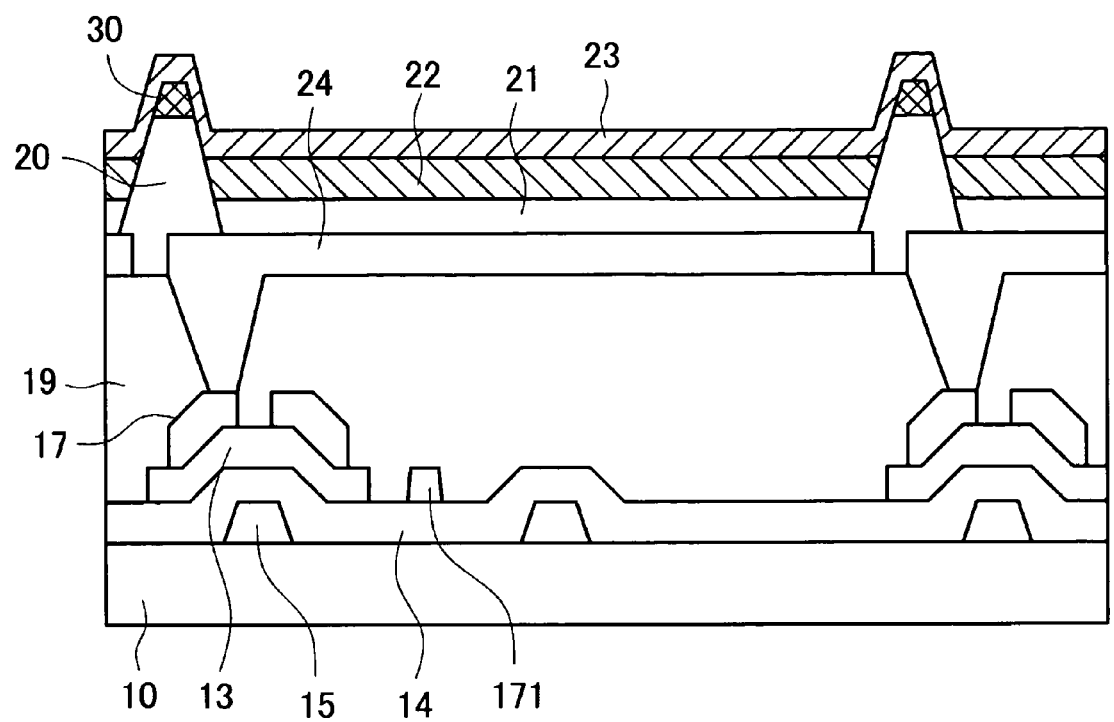
FIG. 5 is a view showing another embodiment of a cross-sectional view taken along a line A-A in FIG. 1 of the embodiment 1.

FIG. 5 shows the example in which the auxiliary line is formed on the IZO film which constitutes the upper electrode 23 formed on the bank 20 by vapor deposition or sputtering. This embodiment is not limited to such an example and, as shown in FIG. 5, firstly, the auxiliary electrode 30 may be formed on the bank 20 by vapor deposition and the IZO film which constitutes the upper electrode 23 maybe formed on the auxiliary electrode 30 by vapor deposition. In this example, both of the auxiliary electrode 30 and the upper electrode 23 are formed by vapor deposition and photolithography is not used and hence, there arises no problem even when either one of the auxiliary electrode 30 and the upper electrode 23 is formed first. Other constitutions of this example are equal to corresponding constitutions in the example where the auxiliary electrode 30 is formed above the upper electrode 23.

Embodiment 2

Figure 6:
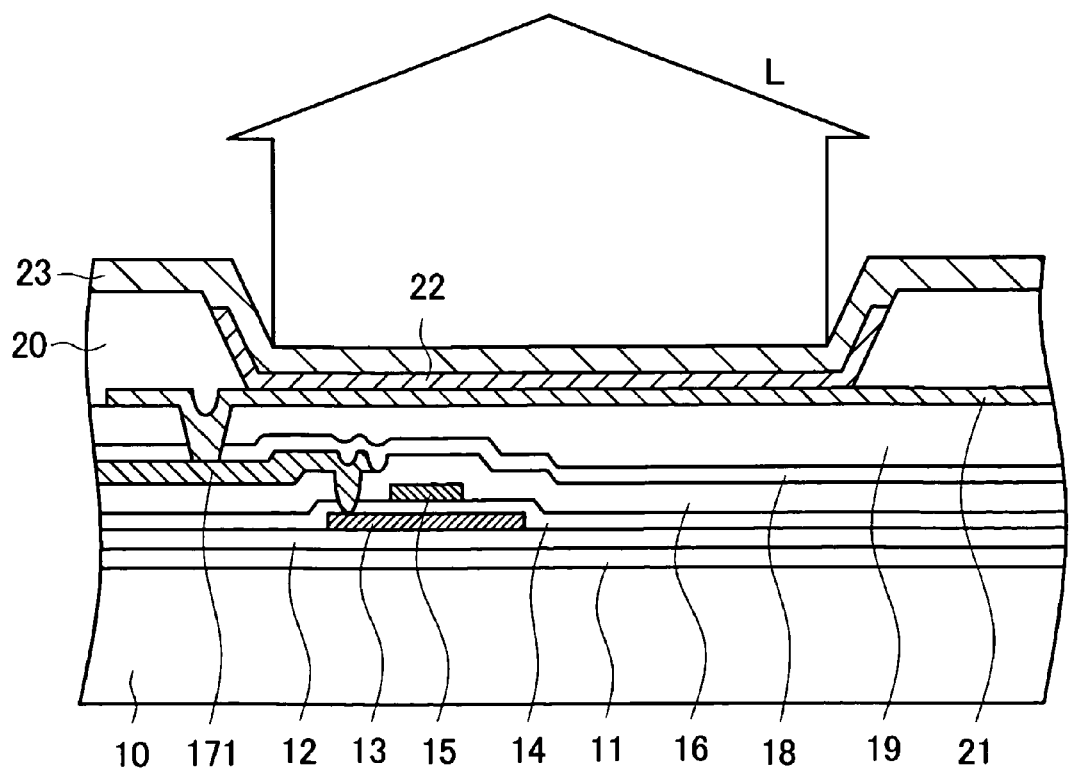
FIG. 6 is a cross-sectional view of the pixel structure of an embodiment 2.

The present invention is, so long as the organic EL display device is the top-emission-type organic EL display device, applicable to irrespective of whether the organic EL layer 22 is of a top anode type or of a top cathode type and irrespective of whether the TFT is of a bottom gate type or of a top gate type. This embodiment is an example in which the present invention is applied to the case where the TFT is of a top gate type and the organic EL layer 22 is of a top anode type. FIG. 6 is a cross-sectional view of a pixel portion of this embodiment. FIG. 6 corresponds to a cross-sectional view taken along a line B-B in FIG. 1.

In FIG. 6, a first background film 11 made of SiN and a second background film 12 made of SiO2 are formed on an element substrate 10. These background films 11, 12 are provided for preventing impurities from a glass substrate from contaminating a semiconductor layer 13. The semiconductor layer 13 is formed on the second back ground film 12. With respect to the semiconductor layer 13, after forming an a-Si film by CVD, the a-Si film is converted into a poly-Si film by radiation of laser beams.

A gate insulation film 14 made of SiO2 is formed so as to cover the semiconductor layer 13. A gate electrode 15 is formed at a position where the gate electrode 15 faces the semiconductor layer 13 in an opposed manner with the gate insulation films 14 sandwiched therebetween. Using the gate electrode 15 as a mask, impurities such as phosphorous or boron are implanted into the semiconductor layer 13 thus imparting conductivity to the semiconductor layer 13 whereby a source portion or a drain portion is formed in the semiconductor layer 13.

An interlayer insulation film 16 made of SiO2 is formed so as to cover the gate electrode 15. The interlayer insulation film 16 is provided for ensuring insulation between the gate line or the gate electrode 15 and a drain line 171. The drain line 171 is formed on the interlayer insulation film 16. The drain line 171 is connected with the drain of the semiconductor layer 13 via through hole formed in the interlayer insulation film 16 and the gate insulation film 14.

Thereafter, to protect the TFT, an inorganic passivation film 18 made of SiN is formed. An organic passivation film 19 is formed on the inorganic passivation film 18. The organic passivation film 19 plays a role of more completely protecting the TFT together with the inorganic passivation film 18 and, at the same time, plays a role of leveling a surface on which the organic EL layer 22 is formed. Accordingly, the organic passivation film 19 has a large thickness of 1 to 4 µm.

A reflection electrode 24 made of Al or Al alloy is formed on the organic passivation film 19. Since Al or Al alloy exhibits high reflectance, Al or Al alloy is preferable as a material of the reflection electrode 24. The reflection electrode 24 is connected with the drain line 171 via a through hole formed in the organic passivation film 19 and the inorganic passivation film 18.

This embodiment provides the top-anode-type organic EL display device and hence, a lower electrode 21 of the organic EL layer 22 constitutes a cathode. Accordingly, Al or Al alloy used for forming the reflection electrode 24 is also used for forming the lower electrode 21 of the organic EL layer 22. This is because Al or Al alloy has a relatively small work function and hence, Al or Al alloy can be used for forming a part which functions as a cathode.

The organic EL layer 22 is formed on the lower electrode 21. In this embodiment, the order of stacked layers of the organic EL layer 22 differs from the corresponding order of the stacked layers of the organic EL layer 22 of the embodiment 1. That is, the organic EL layer 22 is constituted of an electron injection layer, an electron transport layer, a light emission layer, a hole transport layer, and a hole injection layer from below. An upper electrode 23 which constitutes a cathode is formed on the organic EL layer 22. Also in case of the top-anode-type organic EL display device, IZO can be used for forming the upper electrode 23. In a display region, an IZO film is formed over the whole display region by vapor deposition without using a mask. In the same manner as the embodiment 1, a thickness of the IZO film is set to approximately 30 nm for maintaining optical transmissivity.

In the same manner as the embodiment 1, to prevent the rupture of the organic EL layer 22 at an end portion thereof by a broken step, a bank 20 is formed between pixels and pixels. Further, the planar structure of the pixel is substantially equal to the planar structure of the pixel shown FIG. 1 of the embodiment 1. In the same manner as the structure shown FIG. 2 and FIG. 5, the auxiliary electrode 30 in this embodiment can be formed above the bank 20 and either above or below the upper electrode 23.

Figure 7:
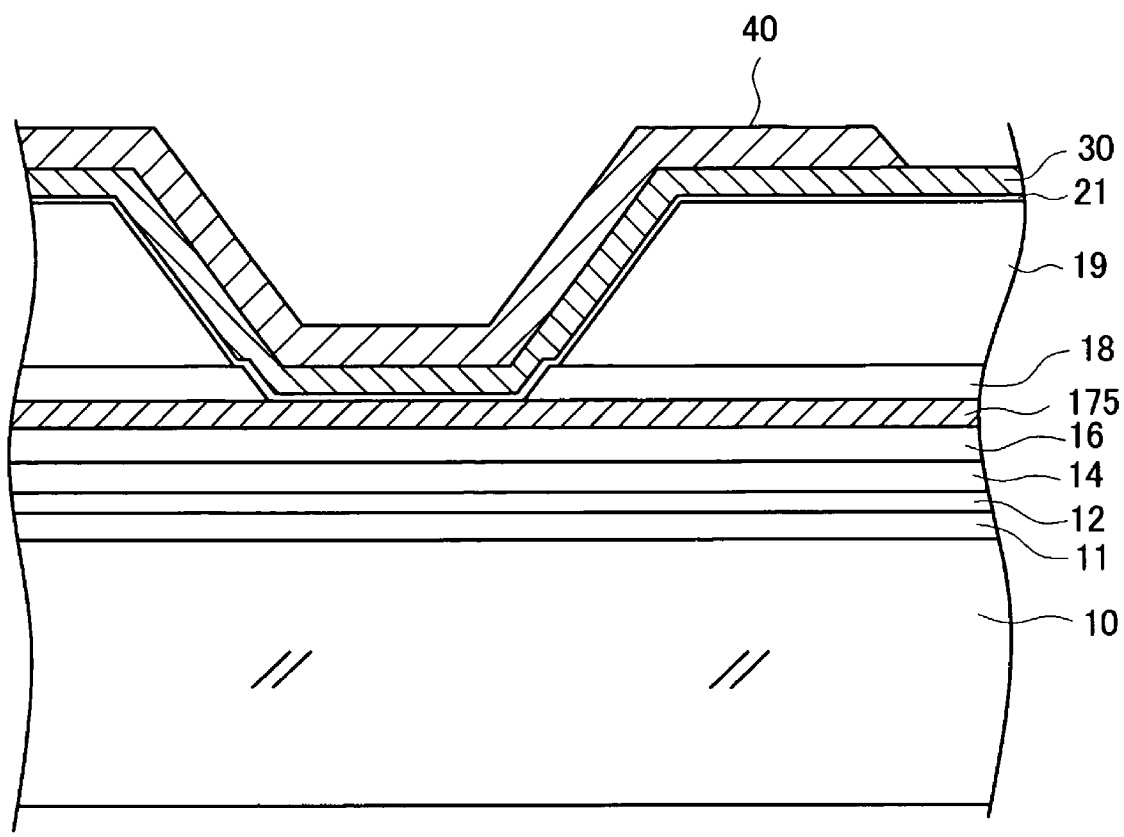
FIG. 7 is a cross-sectional view of a through hole portion of the embodiment 2.

Further, in the same manner as the structure shown in FIG. 3, a contact portion with a current supply line 175 is also formed outside the display region in the lateral direction. FIG. 7 is a cross-sectional view of a contact portion of this embodiment. FIG. 7 shows a cross section corresponding to the cross section taken along a line A-A in FIG. 3. In FIG. 7, the first background film 11 and the second background film 12 are formed on the element substrate 10. The gate insulation film 14 and the interlayer insulation film 16 are formed on these background films 11, 12. Functions, materials and the like of the respective layers of this embodiment are equal to the functions, materials and the like of the respective layers explained in conjunction with FIG. 6.

The current supply line 175 is provided on the interlayer insulation film 16. The current supply line 175 is arranged on the same layer as the drain line and is formed simultaneously with the drain line. The inorganic passivation film 18 is formed so as to cover the current supply line 175, and the organic passivation film 19 is formed on the inorganic passivation film 18. The auxiliary electrode 30 extends over the organic passivation film 19. In this embodiment, outside the display region, an acrylic resin or polyimide resin for forming the bank is removed.

A through hole is formed in the organic passivation film 19 and the inorganic passivation film 18 for connecting the auxiliary electrode 30 and the current supply line 175 with each other. An IZO film which constitutes an upper electrode is formed by vapor deposition so as to cover the through hole and, thereafter, the auxiliary electrode 30 is formed by vapor deposition or sputtering thus connecting the upper electrode 23 and the current supply line 175. To ensure the more reliable connection at the through hole portion, the contact electrode 40 is formed so as to cover the auxiliary electrode 30 at the through hole portion. In the same manner as the embodiment 1, the contact electrode 40 is formed by mask vapor deposition or sputtering.

The contact electrode 40 is made of metal and has a film thickness which is larger than a film thickness of the auxiliary electrode 30. Accordingly, it is possible to ensure the conduction between the current supply line 175 and the upper electrode 23 in the contact hole. In this manner, this embodiment is applicable without any problem irrespective of whether the organic EL layer 22 is of a top anode type or of a top cathode type or irrespective of whether the TFT is of a bottom gate type or of a top gate type. Further, in either case, it is possible to realize a highly reliable top-emission-type organic EL display device which can exhibit uniform screen brightness.

Embodiment 3

Figure 8:
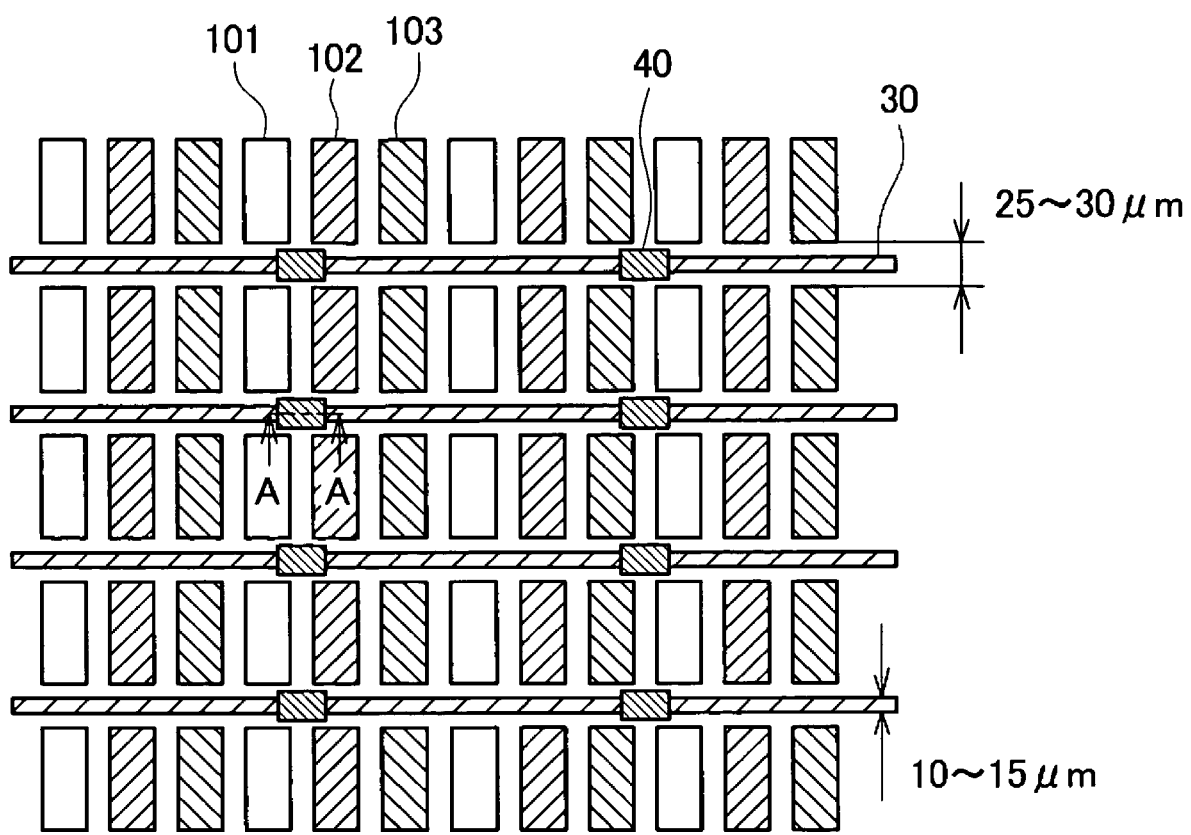
FIG. 8 is a plan view of a display region of an organic EL display device according to an embodiment 3.

In the embodiment 1 and the embodiment 2, the supply of the electric current to the auxiliary electrodes 30 is collectively performed by providing a bus-like contact electrode 40 outside the display region in the lateral direction. The present invention is not limited to such cases, and is also applicable to a case in which the current supply line 175 and the auxiliary electrodes 30 are connected with each other within the display region. FIG. 8 is a plan view of the display region of this embodiment.

In FIG. 8, the pixels are arranged in the same manner as the pixels shown in FIG. 1. Further, the auxiliary electrodes 30 extend in the lateral direction on the screen in the same manner as the auxiliary electrodes 30 shown in FIG. 1. The embodiment 3 shown in FIG. 8 differs form the embodiment 1 shown in FIG. 1 with respect to a point that the contact of the auxiliary electrodes 30 and the current supply line is arranged within the display region. In FIG. 8, the contact portion is formed at an intermediate point between pixels. This is because a space for forming a through hole can be easily ensured in such a portion. The through hole is formed in a bank 20.

In FIG. 8, the contact portion is formed in all auxiliary electrodes 30 in the longitudinal direction, while the contact portion is formed for every five pixels in the lateral direction. Intervals of the formation of the contact portions may be determined based on the degree of difference in potentials of the upper electrodes 23 which is determined based on a size of a screen or the like. A width of the contact portion is set larger than a width of the auxiliary electrode 30. Such width setting is made to suppress the increase of resistance at the through hole portion as much as possible. Further, a width of the contact electrode 40 which is formed at the through hole in an overlapping manner with the auxiliary electrode 30 is set larger than a width of the auxiliary electrode 30 at a place other than the through hole.

Figure 9:
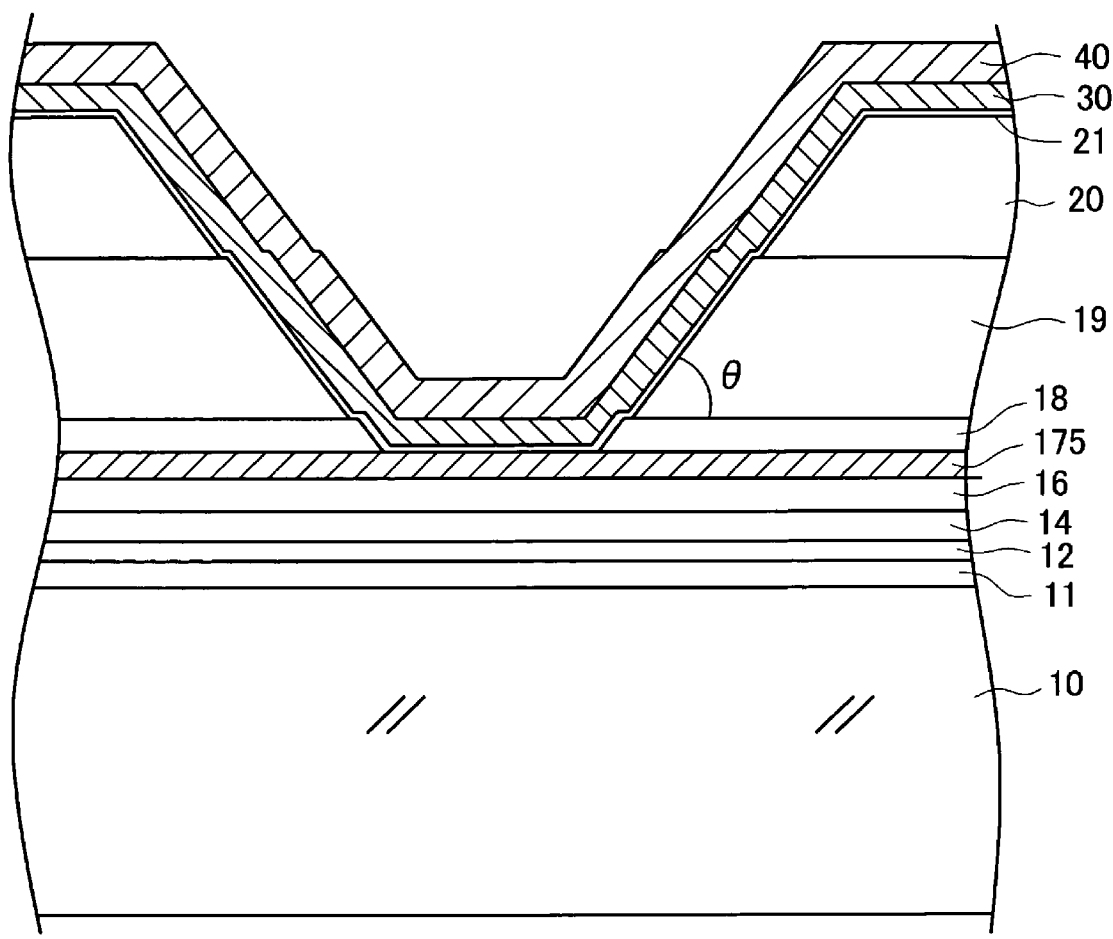
FIG. 9 is a cross-sectional view of a through hole portion of the embodiment 3.

FIG. 9 is a cross-sectional view taken along a line A-A in FIG. 8. A cross section shown in FIG. 9 corresponds to a cross section when the top-gate-type TFT is formed as shown in FIG. 6. That is, on an element substrate 10 made of glass, a first background film 11, a second background film 12, a gate insulation film 14, and an interlayer insulation film 16 are formed. Further, a current supply line 175 is formed in the interlayer insulation film 16. An inorganic passivation film 18 and an organic passivation film 19 are formed so as to cover the current supply line 175. Further, in view of the relationship that an auxiliary line is formed on the bank 20, in FIG. 9, the bank 20 is formed on the organic passivation film 19.

A through hole is formed in the bank 20, the organic passivation film 19 and the inorganic passivation film 18 in a penetrating manner. Such a through hole is formed for connecting the auxiliary line and the current supply line 175 with each other. Since the through hole is formed in the bank 20 in this embodiment, the through hole becomes extremely deep. That is, when the bank 20 is formed of an organic film, a film thickness of the bank 20 is approximately 2 μm, a film thickness of the organic passivation film 19 is approximately 3 μm, and a film thickness of the inorganic passivation film 18 is approximately 0.4 μm and hence, the film thickness in total becomes a large thickness of 5.4 μm. That is, a depth of the through hole becomes 5.4 μm. In spite of the necessity for forming such a deep through hole, in view of the relationship that the through hole is formed in the bank 20, a profile of the through hole is limited. As a result, a taper angle θ of the through hole becomes large. When the taper angle of the through hole is large, a broken step of a conductive film is liable to occur at the through hole portion.

In FIG. 9, an upper electrode 23 is formed so as to cover the through hole. Since a film thickness of the upper electrode 23 is 30 nm, such a deep through hole may easily cause a broken step thus giving rise to conduction failure. The auxiliary electrode 30 is formed on the through hole so as to cover the upper electrode 23. A thickness of the auxiliary electrode 30 is 150 nm. However, with such an extent of film thickness, it is not easy to ensure the conduction at the through hole having the large taper angle θ and a large depth of 5.4 μm. Accordingly, it is difficult to acquire the reliable conduction at the through hole portion only with the auxiliary electrode 30.

According to the present invention, as shown in FIG. 9, a contact electrode 40 having a thickness larger than a thickness of the auxiliary electrode 30 is formed on the through hole portion so as to cover the auxiliary electrode 30. The contact electrode 40 is formed using metal. For example, the contact electrode 40 may be formed using the same material as the auxiliary electrode 30 such as Al, Al alloy, Zn or Mg. In this manner, according to this embodiment, by forming the contact electrode 40 made of metal and having the large thickness in a contact portion, it is possible to stabilize the conduction resistance at the through hole. In this embodiment, by supplying an electric current to a display region such that the electric current is supplied to the upper electrodes 23 via the current supply line 175 and the auxiliary electrodes 30, the potential of the upper electrode 23 can be made more uniform compared to the case of the embodiment 1. Further, since the through hole resistance can be stabilized by the contact electrode 40 in the contact portion, the screen brightness can be made more uniform and, at the same time, the reliability of the organic EL display device can be further increased.

What is claimed is:

1. An organic EL display device having a display region on which pixels each having an organic EL layer sandwiched by an upper electrode and a lower electrode are arranged in a matrix array, wherein
the upper electrode is formed of a transparent electrode, an auxiliary electrode which is conductive with the upper electrode extends between the pixels and the pixels, the auxiliary electrode is connected with a current supply line which supplies an electric current to the upper electrode via a through hole formed in an insulation layer outside the display region, and
a contact electrode is formed on the through hole in an overlapping manner with the auxiliary electrode, and the contact electrode is configured to cover the plurality of through holes in common.

2. An organic EL display device according to claim 1, wherein the auxiliary electrode is formed by mask vapor deposition or mask sputtering, and the contact electrode is formed by mask vapor deposition or mask sputtering.

3. An organic EL display device having a display region on which pixels each having an organic EL layer sandwiched by an upper electrode and a lower electrode are arranged in a matrix array, wherein
the upper electrode is formed of a transparent electrode, an auxiliary electrode which is conductive with the upper electrode extends between the pixels and the pixels, the auxiliary electrode is connected with a current supply line which supplies an electric current to the upper electrode via a through hole formed in an insulation layer within the display region and between the pixels and the pixels,
a contact electrode is formed on the through hole in an overlapping manner with the auxiliary electrode, and
a width of the contact electrode is set larger than a width of the auxiliary electrode.

4. An organic EL display device according to claim 3, wherein a bank is formed between the pixels and the pixels, the auxiliary electrode is formed on the bank, and the through hole is formed in the bank and other insulation layer in a penetrating manner.

5. An organic EL display device according to claim 3, wherein the auxiliary electrode is formed by mask vapor deposition or mask sputtering, and the contact electrode is formed by mask vapor deposition or mask sputtering.

* * * * *